(12) United States Patent
Ping

(10) Patent No.: US 10,193,377 B2
(45) Date of Patent: Jan. 29, 2019

(54) SEMICONDUCTOR ENERGY HARVEST AND STORAGE SYSTEM FOR CHARGING AN ENERGY STORAGE DEVICE AND POWERING A CONTROLLER AND MULTI-SENSOR MEMORY MODULE

(71) Applicant: Samsung Electronics Co., Ltd., Suwon-si, Gyeonggi-do (KR)

(72) Inventor: Zhan Ping, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 936 days.

(21) Appl. No.: 14/194,656

(22) Filed: Feb. 28, 2014

(65) Prior Publication Data

US 2015/0115868 A1    Apr. 30, 2015

Related U.S. Application Data

(60) Provisional application No. 61/897,770, filed on Oct. 30, 2013.

(51) Int. Cl.
*H01L 35/02* (2006.01)
*H02J 7/34* (2006.01)
*H01L 35/00* (2006.01)

(52) U.S. Cl.
CPC .............. *H02J 7/34* (2013.01); *H01L 35/02* (2013.01); *H01L 35/00* (2013.01)

(58) Field of Classification Search
CPC ................... H01L 35/02; H02J 7/34
USPC .......................... 320/101; 361/728
See application file for complete search history.

(56) References Cited

U.S. PATENT DOCUMENTS

| | | | | | |
|---|---|---|---|---|---|
| 4,250,384 | A | * | 2/1981 | Pulvari | H01L 37/02 136/206 |
| 4,658,198 | A | * | 4/1987 | Thurber, Jr. | G01R 19/16576 307/109 |
| 4,823,290 | A | * | 4/1989 | Fasack | G06F 11/3058 340/588 |
| 5,365,477 | A | * | 11/1994 | Cooper, Jr. | H01L 27/0605 257/110 |
| 5,367,670 | A | * | 11/1994 | Ward | G06F 11/0748 714/47.2 |
| 5,375,093 | A | * | 12/1994 | Hirano | G11C 7/00 327/512 |
| 5,572,052 | A | * | 11/1996 | Kashihara | H01L 27/11502 257/295 |

(Continued)

OTHER PUBLICATIONS

"Integrated circuit (IC)," Margaret Rouse, WhatIs.com, Published Sep. 2005, Accessed Online Dec. 22, 2015, http://whatis.techtarget. com/definition/integrated-circuit-IC.*

(Continued)

*Primary Examiner* — Drew A Dunn
*Assistant Examiner* — John Trischler
(74) *Attorney, Agent, or Firm* — Renaissance IP Law Group LLP

(57) ABSTRACT

An embodiment includes a system, comprising: a circuit; an energy harvesting device configured to convert energy from the circuit to electrical energy; an energy storage device configured to store the electrical energy; and a power supply configured to supply power from the energy storage device, and multi-sensor module including such a system.

16 Claims, 8 Drawing Sheets

(56) References Cited

U.S. PATENT DOCUMENTS

| | | | | |
|---|---|---|---|---|
| 5,742,514 A * | 4/1998 | Bonola | ............... | G06F 1/26 379/258 |
| 5,798,961 A * | 8/1998 | Heyden | ............... | H02J 9/061 365/212 |
| 6,233,190 B1 * | 5/2001 | Cooper | ............... | G11C 7/04 365/211 |
| 6,316,714 B1 * | 11/2001 | Kotanagi | ............... | G04C 10/00 136/205 |
| 6,428,918 B1 * | 8/2002 | Fuglevand | ............... | H01M 8/04007 320/101 |
| 6,438,057 B1 * | 8/2002 | Ruckerbauer | ............... | G11C 7/04 365/211 |
| 6,453,218 B1 * | 9/2002 | Vergis | ............... | G05D 23/1917 365/211 |
| 6,545,895 B1 * | 4/2003 | Li | ............... | G06F 13/409 365/51 |
| 6,552,945 B2 * | 4/2003 | Cooper | ............... | G11C 7/04 365/211 |
| 6,597,062 B1 * | 7/2003 | Li | ............... | G11C 5/063 257/686 |
| 6,651,190 B1 * | 11/2003 | Worley | ............... | G06F 11/0709 709/224 |
| 6,705,877 B1 * | 3/2004 | Li | ............... | H05K 1/144 257/686 |
| 6,778,453 B2 * | 8/2004 | Cooper | ............... | G11C 7/04 365/211 |
| 6,791,877 B2 * | 9/2004 | Miura | ............... | G11C 5/02 365/185.11 |
| 6,858,335 B2 * | 2/2005 | Schmidt | ............... | H01M 8/0432 429/430 |
| 6,928,512 B2 * | 8/2005 | Ayukawa | ............... | G11C 11/005 365/222 |
| 6,947,287 B1 * | 9/2005 | Zansky | ............... | G06F 1/26 361/690 |
| 6,952,368 B2 * | 10/2005 | Miura | ............... | G11C 5/02 365/185.11 |
| 6,999,339 B2 * | 2/2006 | Tuttle | ............... | G11C 11/16 365/158 |
| 7,035,157 B2 * | 4/2006 | Chang | ............... | G11C 11/406 365/211 |
| 7,068,562 B2 * | 6/2006 | Miura | ............... | G11C 5/02 365/189.12 |
| 7,185,229 B2 * | 2/2007 | Cromer | ............... | G06F 11/2294 713/300 |
| 7,225,276 B2 * | 5/2007 | Garnett | ............... | G06F 1/183 361/728 |
| 7,227,774 B2 * | 6/2007 | Tuttle | ............... | G11C 11/16 365/158 |
| 7,260,007 B2 * | 8/2007 | Jain | ............... | G01K 7/425 365/211 |
| 7,280,426 B2 * | 10/2007 | Miura | ............... | G11C 5/02 365/201 |
| 7,295,442 B2 * | 11/2007 | Garnett | ............... | G06F 1/183 361/679.31 |
| 7,413,342 B2 * | 8/2008 | Mukherjee | ............... | G01K 1/026 327/512 |
| 7,428,644 B2 * | 9/2008 | Jeddeloh | ............... | G06F 1/206 713/300 |
| 7,437,579 B2 * | 10/2008 | Jeddeloh | ............... | G06F 1/206 713/300 |
| 7,450,456 B2 * | 11/2008 | Jain | ............... | G11C 5/04 365/189.02 |
| 7,528,502 B2 * | 5/2009 | Maeda | ............... | H02J 7/34 307/46 |
| 7,548,451 B2 * | 6/2009 | Oh | ............... | G11C 8/10 365/163 |
| 7,554,830 B2 * | 6/2009 | Miura | ............... | G11C 5/02 365/230.01 |
| 7,655,858 B2 * | 2/2010 | Esser | ............... | H01L 35/02 136/205 |
| 7,726,144 B2 | 6/2010 | Larson et al. | | |
| 7,764,184 B2 | 7/2010 | Dobbs et al. | | |
| 7,765,825 B2 | 8/2010 | Wyatt | | |
| 7,775,710 B2 * | 8/2010 | Mukherjee | ............... | G01K 1/026 327/512 |
| 7,872,895 B2 * | 1/2011 | Miura | ............... | G11C 5/02 365/230.01 |
| 8,006,121 B1 * | 8/2011 | Samoilova | ............... | G06F 11/2294 714/2 |
| 8,060,774 B2 * | 11/2011 | Smith | ............... | G06F 11/1076 714/6.22 |
| 8,122,265 B2 | 2/2012 | Radhakrishnan et al. | | |
| 8,160,655 B2 * | 4/2012 | Kroll | ............... | H04M 1/05 320/101 |
| 8,162,540 B2 * | 4/2012 | Mukherjee | ............... | G01K 1/026 374/170 |
| 8,184,439 B2 * | 5/2012 | Baek | ............... | H01L 23/38 165/80.3 |
| 8,222,858 B2 * | 7/2012 | Saeki | ............... | H01M 8/0494 320/101 |
| 8,432,064 B2 * | 4/2013 | Maeda | ............... | H02J 7/34 307/44 |
| 8,432,716 B2 * | 4/2013 | Miura | ............... | G11C 5/02 365/230.03 |
| 8,443,226 B2 * | 5/2013 | Samoilova | ............... | G06F 11/2294 714/2 |
| 8,446,750 B2 * | 5/2013 | Lim | ............... | G06F 13/4243 365/64 |
| 8,458,804 B1 * | 6/2013 | Hyde | ............... | G06F 21/00 726/26 |
| 8,496,378 B2 * | 7/2013 | Mukherjee | ............... | G01K 1/026 374/170 |
| 8,519,667 B2 * | 8/2013 | Tsai | ............... | H02J 7/025 320/108 |
| 8,552,283 B2 * | 10/2013 | Dede | ............... | H01L 23/38 136/201 |
| 8,583,869 B2 * | 11/2013 | Hinkle | ............... | G06F 13/20 710/313 |
| 8,593,826 B2 * | 11/2013 | Joe | ............... | G02B 6/4214 361/760 |
| 8,656,072 B2 * | 2/2014 | Hinkle | ............... | G06F 13/20 710/301 |
| 8,684,114 B2 * | 4/2014 | Schroeder | ............... | H01L 35/00 136/240 |
| 8,730,715 B2 * | 5/2014 | Katti | ............... | G11C 11/16 257/678 |
| 8,730,741 B2 * | 5/2014 | Shibata | ............... | G11C 16/10 365/185.05 |
| 8,763,148 B2 * | 6/2014 | Hyde | ............... | G06F 21/00 726/26 |
| 8,925,078 B2 * | 12/2014 | Hyde | ............... | G06F 21/00 726/22 |
| 9,020,781 B2 * | 4/2015 | Lieberman | ............... | G06F 11/348 702/188 |
| 9,026,401 B2 * | 5/2015 | Lieberman | ............... | G06F 11/348 702/188 |
| 9,158,716 B2 * | 10/2015 | Hinkle | ............... | G06F 13/20 |
| 9,235,726 B2 * | 1/2016 | Hyde | ............... | G06F 21/00 |
| 9,323,958 B2 * | 4/2016 | Mostovych | ............... | G06F 21/86 |
| 9,390,035 B2 * | 7/2016 | Hinkle | ............... | G06F 13/20 |
| 9,405,913 B2 * | 8/2016 | Krummel | ............... | G06F 21/554 |
| 9,740,638 B2 * | 8/2017 | Hyde | ............... | G06F 21/00 |
| 9,814,284 B2 * | 11/2017 | Tamaki | ............... | G06F 1/163 |
| 2001/0009528 A1 * | 7/2001 | Cooper | ............... | G11C 7/04 365/212 |
| 2002/0072868 A1 * | 6/2002 | Bartone | ............... | H02J 3/14 702/62 |
| 2002/0185337 A1 * | 12/2002 | Miura | ............... | G11C 5/02 185/11 |
| 2002/0199056 A1 * | 12/2002 | Ayukawa | ............... | G11C 11/005 711/106 |
| 2003/0030976 A1 * | 2/2003 | Garnett | ............... | G06F 1/183 361/679.49 |
| 2003/0091882 A1 * | 5/2003 | Schmidt | ............... | H01M 8/0432 429/430 |
| 2003/0174559 A1 * | 9/2003 | Cooper | ............... | G11C 7/04 365/200 |

(56) References Cited

U.S. PATENT DOCUMENTS

| | | | |
|---|---|---|---|
| 2004/0078153 A1* | 4/2004 | Bartone | H02J 3/14 702/57 |
| 2004/0164702 A1* | 8/2004 | Holmes | H01M 16/006 320/101 |
| 2004/0199730 A1* | 10/2004 | Eggers | G06F 1/206 711/154 |
| 2004/0213043 A1* | 10/2004 | Tuttle | G11C 11/16 365/173 |
| 2004/0223366 A1* | 11/2004 | Miura | G11C 5/02 365/154 |
| 2004/0260957 A1* | 12/2004 | Jeddeloh | G06F 1/206 713/300 |
| 2005/0138470 A1* | 6/2005 | Cromer | G06F 11/2294 714/22 |
| 2005/0161072 A1* | 7/2005 | Esser | H01L 35/02 136/205 |
| 2005/0181246 A1* | 8/2005 | Nakaji | B60L 11/1885 429/429 |
| 2005/0232059 A1* | 10/2005 | Miura | G11C 5/02 365/230.03 |
| 2006/0044910 A1* | 3/2006 | Chang | G11C 11/406 365/222 |
| 2006/0190210 A1* | 8/2006 | Mukherjee | G01K 1/026 702/130 |
| 2006/0203442 A1* | 9/2006 | Goodwin | G11C 5/04 361/679.32 |
| 2006/0221741 A1* | 10/2006 | Jain | G01K 7/425 365/211 |
| 2006/0221756 A1* | 10/2006 | Miura | G11C 5/02 365/230.03 |
| 2006/0262591 A1* | 11/2006 | Ambroggi | G11C 16/30 365/129 |
| 2007/0096564 A1* | 5/2007 | Maeda | H02J 7/34 307/87 |
| 2007/0107766 A1* | 5/2007 | Langley, II | H02J 17/00 136/243 |
| 2007/0194008 A1* | 8/2007 | Seger | F02M 31/13 219/600 |
| 2007/0194009 A1* | 8/2007 | Seger | H05B 1/0236 219/600 |
| 2007/0211543 A1* | 9/2007 | Miura | G11C 5/02 365/49.1 |
| 2007/0211548 A1* | 9/2007 | Jain | G11C 5/04 365/211 |
| 2008/0010435 A1* | 1/2008 | Smith | G06F 11/1076 712/10 |
| 2008/0055972 A1* | 3/2008 | Oh | G11C 8/10 365/163 |
| 2008/0126690 A1* | 5/2008 | Rajan | G06F 12/06 711/105 |
| 2008/0278901 A9* | 11/2008 | Goodwin | G11C 5/04 361/679.32 |
| 2009/0000652 A1* | 1/2009 | von Windheim | H01L 23/38 136/230 |
| 2009/0007953 A1* | 1/2009 | Hsu | F23C 13/00 136/205 |
| 2009/0028212 A1* | 1/2009 | Mukherjee | G01K 1/026 374/170 |
| 2009/0028213 A1* | 1/2009 | Kund | G01K 3/005 374/178 |
| 2009/0147607 A1* | 6/2009 | Nin | G11C 7/04 365/222 |
| 2009/0260668 A1* | 10/2009 | Maeda | H02J 7/34 136/205 |
| 2009/0268502 A1* | 10/2009 | Miura | G11C 5/02 365/63 |
| 2009/0312595 A1* | 12/2009 | Leuthardt | G06F 19/3456 600/27 |
| 2009/0312668 A1* | 12/2009 | Leuthardt | G06F 19/3456 600/558 |
| 2010/0004762 A1* | 1/2010 | Leuthardt | G06F 19/3456 700/28 |
| 2010/0015583 A1* | 1/2010 | Leuthardt | G06F 19/3456 434/236 |
| 2010/0017001 A1* | 1/2010 | Leuthardt | G06F 19/3456 700/94 |
| 2010/0022820 A1* | 1/2010 | Leuthardt | G06F 19/3456 600/27 |
| 2010/0041958 A1* | 2/2010 | Leuthardt | G06F 19/3456 463/30 |
| 2010/0042578 A1* | 2/2010 | Leuthardt | G06F 19/3456 706/59 |
| 2010/0063368 A1* | 3/2010 | Leuthardt | G06F 19/3456 600/301 |
| 2010/0069724 A1* | 3/2010 | Leuthardt | G06F 19/3456 600/301 |
| 2010/0076249 A1* | 3/2010 | Leuthardt | G06F 19/3456 600/27 |
| 2010/0081860 A1* | 4/2010 | Leuthardt | G06F 19/3456 600/27 |
| 2010/0081861 A1* | 4/2010 | Leuthardt | G06F 19/3456 600/27 |
| 2010/0100036 A1* | 4/2010 | Leuthardt | G06F 19/3456 604/65 |
| 2010/0125561 A1* | 5/2010 | Leuthardt | G06F 19/3456 707/706 |
| 2010/0130811 A1* | 5/2010 | Leuthardt | G06F 19/3456 600/27 |
| 2010/0271199 A1* | 10/2010 | Belov | G01M 5/0008 340/539.3 |
| 2010/0277222 A1* | 11/2010 | Mukherjee | G01K 1/026 327/512 |
| 2010/0296236 A1* | 11/2010 | Schuette | G06F 1/187 361/679.31 |
| 2011/0010586 A1* | 1/2011 | Mishuku | G06F 11/2247 714/32 |
| 2011/0023928 A1* | 2/2011 | Leng | H01L 23/38 136/205 |
| 2011/0032679 A1* | 2/2011 | Baek | H01L 23/38 361/715 |
| 2011/0054714 A1 | 3/2011 | Santos et al. | |
| 2011/0069464 A1* | 3/2011 | Joe | G02B 6/4214 361/783 |
| 2011/0078366 A1* | 3/2011 | Miura | G11C 5/02 711/103 |
| 2011/0144950 A1* | 6/2011 | Lieberman | G06F 11/348 702/188 |
| 2011/0144951 A1* | 6/2011 | Lieberman | G06F 11/348 702/188 |
| 2011/0153903 A1* | 6/2011 | Hinkle | G06F 13/20 710/313 |
| 2011/0168223 A1* | 7/2011 | Dede | H01L 23/38 136/205 |
| 2011/0208993 A1* | 8/2011 | Samoilova | G06F 11/2294 714/2 |
| 2012/0059967 A1* | 3/2012 | Hinkle | G06F 13/20 710/313 |
| 2012/0059970 A1* | 3/2012 | Hinkle | G06F 13/20 710/316 |
| 2012/0089854 A1* | 4/2012 | Breakstone | G06F 1/30 713/323 |
| 2012/0124590 A1 | 5/2012 | Balakrishnan et al. | |
| 2012/0159045 A1* | 6/2012 | Hinkle | G06F 13/20 711/103 |
| 2012/0201273 A1* | 8/2012 | Mukherjee | G01K 1/026 374/183 |
| 2012/0206977 A1* | 8/2012 | Shibata | G11C 16/10 365/185.22 |
| 2012/0286724 A1* | 11/2012 | Tsai | H02J 7/025 320/108 |
| 2012/0312345 A1* | 12/2012 | Ward | H01L 35/02 136/230 |
| 2013/0028033 A1* | 1/2013 | Lim | G06F 13/4243 365/191 |
| 2013/0145081 A1* | 6/2013 | Miura | G11C 5/02 711/103 |
| 2013/0180563 A1* | 7/2013 | Makansi | H01L 35/32 136/206 |

(56) References Cited

U.S. PATENT DOCUMENTS

| | | |
|---|---|---|
| 2013/0208524 A1 | 8/2013 | Sung et al. |
| 2013/0223001 A1 | 8/2013 | Ryu et al. |
| 2013/0234519 A1* | 9/2013 | Maeda ............... H02J 7/34 307/64 |
| 2013/0250662 A1* | 9/2013 | Katti ............... G11C 11/16 365/158 |
| 2013/0308942 A1 | 11/2013 | Ji et al. |
| 2013/0311717 A1* | 11/2013 | Kim ............... G06F 12/0246 711/104 |
| 2013/0327370 A1* | 12/2013 | Ward ............... H01L 35/30 136/230 |
| 2013/0328416 A1* | 12/2013 | Whitworth ............... H02J 17/00 307/149 |
| 2014/0016404 A1* | 1/2014 | Kim ............... G11C 11/165 365/158 |
| 2014/0016426 A1* | 1/2014 | Hyde ............... G06F 21/00 365/228 |
| 2014/0176041 A1* | 6/2014 | Sun ............... H01L 35/30 320/101 |
| 2014/0237177 A1 | 8/2014 | Yu et al. |
| 2014/0250525 A1* | 9/2014 | Hyde ............... G06F 21/00 726/22 |
| 2014/0299169 A1* | 10/2014 | Schneider ............... H01L 35/02 136/201 |
| 2014/0355327 A1 | 12/2014 | Byun et al. |
| 2015/0003172 A1 | 1/2015 | Kim et al. |
| 2015/0016047 A1 | 1/2015 | Seok et al. |
| 2015/0026397 A1* | 1/2015 | Ping ............... G11C 5/04 711/105 |
| 2015/0077438 A1* | 3/2015 | Tamaki ............... G06F 1/163 345/672 |
| 2015/0113665 A1* | 4/2015 | Hyde ............... G06F 21/00 726/27 |
| 2015/0236512 A1* | 8/2015 | Whitney ............... H05K 7/1492 307/80 |
| 2016/0062435 A1* | 3/2016 | Arakawa ............... G06F 11/1008 714/764 |
| 2016/0117264 A1* | 4/2016 | Hyde ............... G06F 21/00 713/193 |
| 2017/0153994 A1* | 6/2017 | Royer, Jr. ............... G06F 13/30 |
| 2018/0064216 A1* | 3/2018 | Tamaki ............... G06F 1/163 |

OTHER PUBLICATIONS ( "QuickSpecs HP ProBook 6450b & 6550b Notebook PCs," HP, DA-13616 Canada, Version 17, Feb. 15, 2012, www8.hp.com/h20195/v2/GetPDF.aspx/c04290875.pdf ).*
( HP ProBook 6455b Notebook PC HP ProBook 6555b Notebook PC HP ProBook 6450b Notebook PC HP ProBook 6550b Notebook PC Maintenance and Service Guide, HP, Published Aug. 27, 2012, www.hp.com/ctg/Manual/c03471180.pdf ).*
( "Nahalem and Core i7—how fast can they go?," PC & Tech Authority, Published Jan. 28, 2009, Accessed May 10, 2016, www.pcauthority.com.au/Feature/135504,nehalem-and-core-i7-how-fast-can-they-go.aspx/1 ).*
( "SSD vs HDD," Andrew Baxter, Storage Review, Published Dec. 4, 2012, Accessed Online Jun. 10, 2016, web.archive.org/web/20121204003253/http://www.storagereview.com/ssd_vs_hdd ).*

* cited by examiner

SEMICONDUCTOR ENERGY HARVEST AND STORAGE SYSTEM FOR CHARGING AN ENERGY STORAGE DEVICE AND POWERING A CONTROLLER AND MULTI-SENSOR MEMORY MODULE

BACKGROUND

This disclosure relates to energy harvest and storage systems, multi-sensor modules and, in particular, energy harvest and storage system and multi-sensor modules with energy harvesting and environmental monitoring.

Data centers may include a variety of components, such as server nodes, data storage, or the like. These components generate large amounts of waste heat that is removed from the components and exchanged with the atmosphere using an air conditioning system. The waste heat and air conditioning system increase the energy usage and hence, the total cost of ownership of the data center. Moreover, some components, such as memory modules, include only temperature sensors. Accordingly, an amount of cooling provided by airflow must be designed to accommodate worst case environmental conditions for a given temperature, resulting in a further increase in costs.

SUMMARY

An embodiment includes a system, comprising: a circuit; an energy harvesting device configured to convert energy from the circuit to electrical energy; an energy storage device configured to store the electrical energy; and a power supply configured to supply power from the energy storage device.

Another embodiment includes a system, comprising: a module; a semiconductor device disposed in the module; and a plurality of sensors disposed in the module. A type of at least one of the sensors is different from a type of another sensor of the sensors.

Another embodiment includes a method, comprising: harvesting energy from a semiconductor device on a module; storing the harvested energy in an energy storage device from on the module; and powering at least part of the module from the energy storage device.

DETAILED DESCRIPTION

Figure 1:
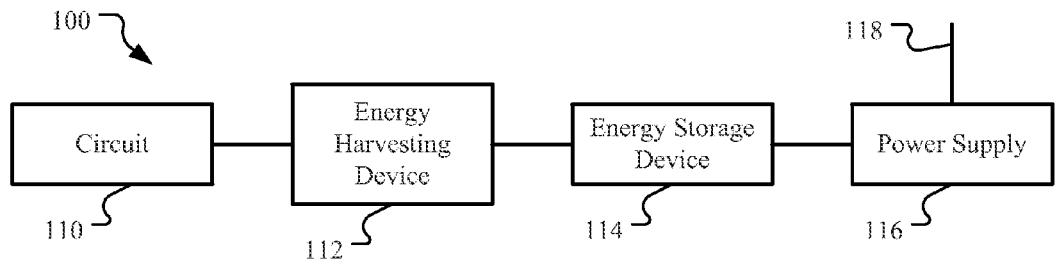
FIG. 1 is a block diagram of an energy harvest and storage system according to an embodiment.

The embodiments relate to energy harvest and storage system and multi-sensor modules. The following description is presented to enable one of ordinary skill in the art to understand the embodiments and is provided in the context of a patent application and its requirements. Various modifications to the exemplary embodiments and the generic principles and features described herein will be readily apparent. The exemplary embodiments are mainly described in terms of particular methods and systems provided in particular implementations.

However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made in other embodiments. The exemplary embodiments will also be described in the context of particular methods having certain steps. However, the method and system operate effectively for other methods having different and/or additional steps and steps in different orders that are not inconsistent with the exemplary embodiments. Thus, embodiments are not intended to be limited to the particular embodiments shown, but are to be accorded the widest scope consistent with the principles and features described herein.

The exemplary embodiments are described in the context of particular systems or modules having certain components. One of ordinary skill in the art will readily recognize that embodiments may have other and/or additional components and/or other features not inconsistent with the embodiments described herein. One of ordinary skill in the art will also readily recognize that the method and system are described in the context of a structure having a particular relationship to a substrate. However, one of ordinary skill in the art will readily recognize that the method and system are consistent with other structures. In addition, one of ordinary skill in the art will readily recognize that the layers could have another structure. The method and system are also described in the context of single elements. However, one of ordinary skill in the art will readily recognize that the method and system are consistent with the use of multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

FIG. 1 is a block diagram of an energy harvest and storage system according to an embodiment. In this embodiment, the system 100 includes a circuit 110, an energy harvesting device 112, an energy storage device 114, and a power supply 116. The circuit 110 may take a variety of forms. For example, the circuit 110 may include a circuit board with one or more semiconductor devices. In another example, the circuit 110 may include a memory module, such as a dual in-line memory module (DIMM) or other varieties of memory modules. In yet another example, the circuit 110 may be a rack-mountable system, such as a rack-mountable server, storage device, or the like. In a particular example, the circuit may include a rack-mountable system within a data center. In still another example, the circuit 110 may include expansion bus mountable cards, such as Peripheral Component Interconnect Express (PCIe) or other bus based cards.

The energy harvesting device 112 may be configured to convert energy from the circuit 110 to electrical energy. For example, the energy harvesting device 112 may include devices, structures, and/or materials configured to convert thermal energy into electrical energy, such as thermoelectric materials. In a particular example, the energy harvesting device 112 may be configured to convert energy from the circuit 110 that would otherwise be radiated, emitted, or otherwise removed as waste energy. Although thermal energy is used as an example, other forms of energy may be converted into electrical energy by the energy harvesting device 112.

The energy storage device 114 may be configured to store the electrical energy from the energy harvesting device 114. For example, the energy storage device 114 may include a capacitor such as a super capacitor, a battery such as a rechargeable battery, a solid state storage device such as a solid state battery, or the like. Any device that may store and supply energy may be used as the energy storage device 114.

The power supply 116 may be configured to supply power from the energy storage device 116. For example, the power supply 116 may be configured to supply power to at least a part of the circuit 110. In another example, the power supply 116 may be configured to supply power to another circuit or device separate from the circuit 110.

In an embodiment, the power supply 116 may be configured to receive power 118 from an external source and supply that power to the circuit 110 or other circuit. For example, the power supply 116 may receive power 118 from an external source, such as a power source external to the circuit 116, a mains power source, or the like. As will be described in further detail below, in an embodiment, the power supply 116 may switch between supplying power using the power 118 and the energy storage device 114.

In an embodiment, the circuit 110 may include a central processing unit (CPU). The energy harvesting device 112 may be configured to convert thermal energy from the CPU into electrical energy. In particular, a CPU may be a device that generates a relative maximum amount of heat in the circuit 110. Although the CPU has been used as an example, the energy harvesting device 112 may be configured to convert thermal energy from any device of the circuit 110 into electrical energy.

In an embodiment, the energy harvesting device 112, energy storage device 114 and the power supply 116 may be separate from the circuit 110. However, in other embodiments, one or more of the energy harvesting device 112, energy storage device 114 and the power supply 116 may be included in the circuit 110. For example, the energy harvesting device 112, energy storage device 114 and the power supply 116 may be mounted on a circuit board of the circuit 110.

Figure 2:
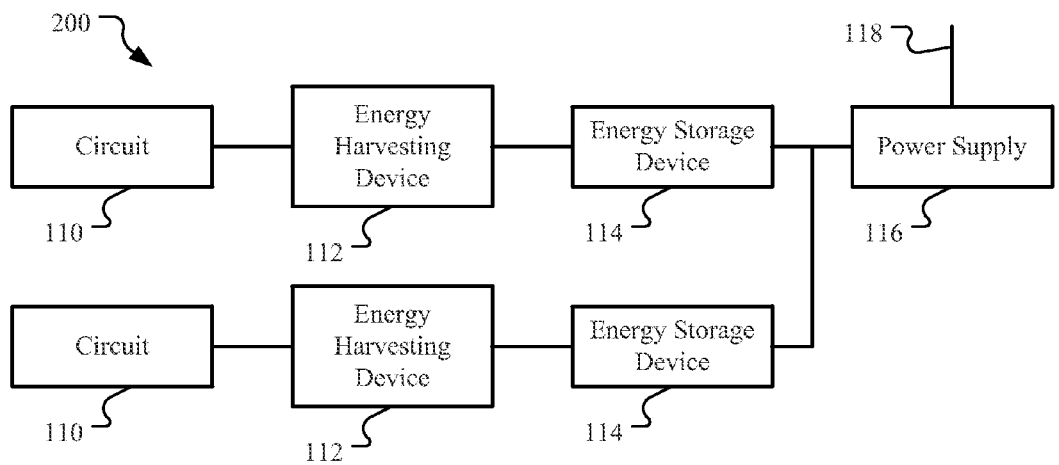
FIG. 2 is a block diagram of an energy harvest and storage system according to another embodiment.

FIG. 2 is a block diagram of an energy harvest and storage system according to another embodiment. In this embodiment, the system 200 includes multiple circuits 110, each with a corresponding energy harvesting device 112 and energy storage device 114. The power supply 116 may be configured to supply power from the energy storage devices 114. For example, in one mode of operation, the power supply 116 may be configured to supply power from only one of the energy storage devices 114 at a time. In another example, the power supply 116 may be configured to supply power from both of the energy storage devices 114.

Figure 3:
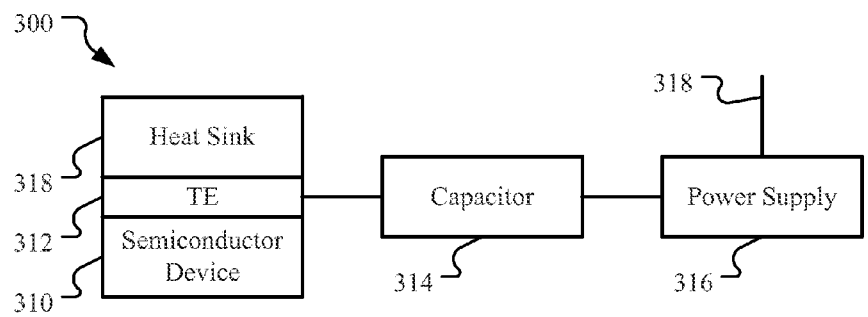
FIG. 3 is a block diagram of an energy harvest and storage system according to another embodiment.

Although two sets of circuits 110, energy harvesting devices 112, and energy storage devices 114 have been illustrated, any number of sets may be present. In addition, multiple energy harvesting devices 112 may supply electrical energy to a single energy storage device 114. Furthermore, in other embodiments, FIG. 3 is a block diagram of an energy harvest and storage system according to another embodiment. In this embodiment, the system 300 includes a semiconductor device 310. The semiconductor device 310 may be a processor, a memory device, or the like. A thermoelectric (TE) material 312 is disposed on the semiconductor device 310. A heat sink 320 is disposed on the TE material 312. The TE material 312 is configured to convert at least a part of thermal energy from the semiconductor device 310 into electrical energy.

The TE material 312 is coupled to a capacitor 314. For example, the capacitor may be a supercapacitor, an ultracapacitor, or the like. The capacitor 314 is coupled to a power supply 316. The power supply 316 may be configured to supply power from an external source 318. In an embodiment, the TE material 312 may generate a relatively small amount of power; however, when aggregated over time, the amount of stored energy may be sufficient to power, through the power supply 316, a desired circuit for a desired function.

Figure 4:
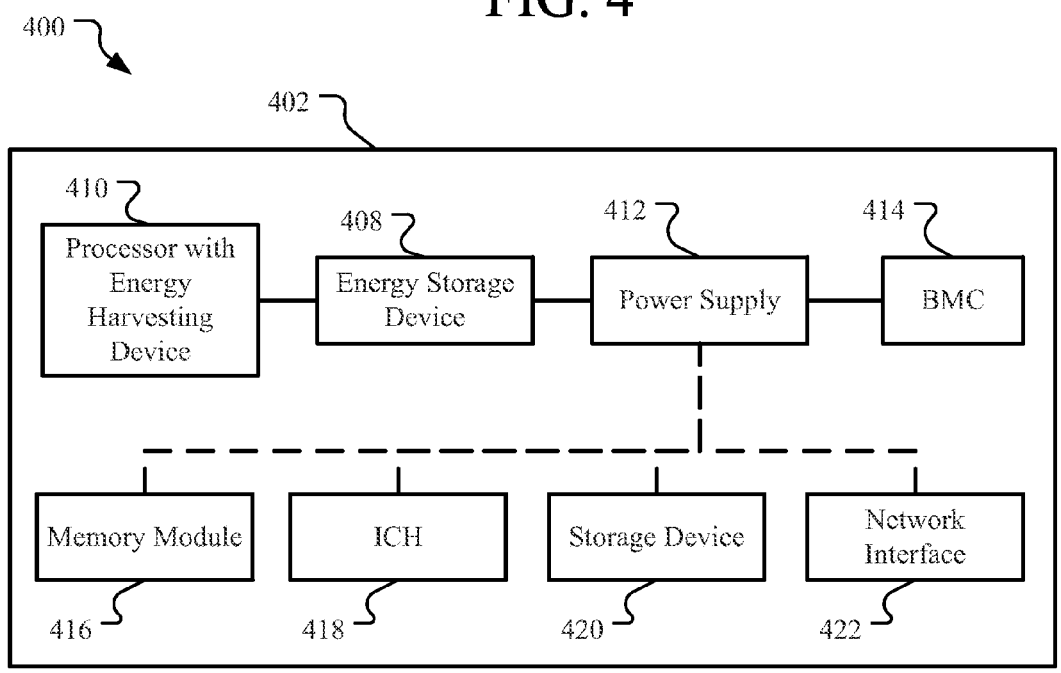
FIG. 4 is a block diagram of a module including an energy harvest and storage system according to an embodiment.

FIG. 4 is a block diagram of a module including an energy harvest and storage system according to an embodiment. In this embodiment, the system 400 includes a circuit board 402. An integrated circuit may be disposed on the circuit board 402. Here, a processor 410 is used as an example of an integrated circuit. The processor 410 includes an energy harvesting device as described above. The energy harvesting device is configured to convert thermal energy from the processor 410 to electrical energy.

An energy storage device 408 is coupled to the processor 410. The energy storage device 408 is configured to store energy from the energy harvesting device of the processor 410. A power supply 412 is configured to supply power from the energy storage device 408 to at least part of the devices on the circuit board 402.

A controller is disposed on the circuit board 402. Here, a baseboard management controller (BMC) 414 is used as an example of a controller; however, the controller may be another type of controller. The BMC 414 is configured to manage an operation of the circuit board. For example, the BMC 414 may be configured to monitor various parameters of devices on the circuit board 402, engage functions of the devices on the circuit board 402, monitor and control environmental parameters, or the like.

In an embodiment, the energy storage device 408 is configured to supply power to the BMC 414. In a particular example, the BMC 414 may be configured to manage cooling of the circuit board 402, provide a data management interface, or the like. Accordingly, the BMC 414 may need to be operating substantially continuously. By using the harvested energy, the BMC 414 may be able to operate even if another source of power has failed.

Although a processor 410 has been described as the integrated circuit with the energy harvesting device, other integrated circuits on the circuit board may include an energy harvesting device. In addition, the circuit board 402 may include other processors 410 that include energy harvesting devices to supply energy to the energy storage device 408. In another embodiment, the processor 410 may not include an energy harvesting device while another device or devices include energy harvesting devices.

In this embodiment, the circuit board 402 includes a memory device 416, an input/output controller hub (ICH) 418, a storage device 420, and a network interface 422. However, in other embodiments, other devices, systems, or the like may be present on the circuit board 402. The power supply 412 may be configured to supply power from the energy storage device 408 to the memory device 416, the ICH 418, the storage device 420, the network interface 422, a combination of multiple such devices, or the like. The connection from the power supply 412 to the devices is illustrated with a dashed line to illustrate the optional supply of power from the energy storage device 408; however, the power supply 412 may be configured to supply power to the devices from other sources, such as an external power source.

In an embodiment, by using the harvested energy, the total cost of ownership may be reduced. For example, by harvesting thermal energy, both the thermal dissipation may be reduced and, if the harvested energy is used to power at least a part of the devices of the system, the energy usage of the system 400 may be reduced.

Figure 5:
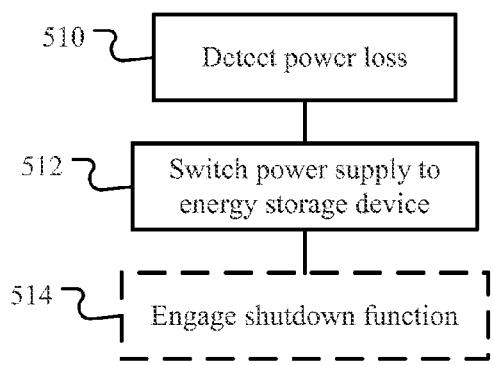
FIG. 5 is a flowchart illustrating power switching using an energy harvest and storage system according to an embodiment.

FIG. 5 is a flowchart illustrating power switching using an energy harvest and storage system according to an embodiment. In this embodiment, a power loss is detected in 510. In 512, a power supply is switched to an energy storage device. Using FIG. 4 as an example, the BMC 414 may detect a power loss. The BMC 414 may be configured to cause the power supply 412 to use the energy storage device 408. In a particular example, the BMC may be powered from the energy storage device 408. In another embodiment, the switching in 512 may be handled by the power supply 412.

In an embodiment, in 514, a shutdown function may be engaged. For example, the BMC 414 may be configured to cause an integrated circuit on the circuit board 402 to perform a shutdown function. This function may be triggered based on a loss of power to the circuit. For example, the power supplied from the energy storage device 408 may be sufficient to allow the processor 410 to save data from the memory 416 to the storage device 420, or otherwise provide a grace period for the system 400 to enter a safe mode in which the system may safely shutdown.

Figure 6A:
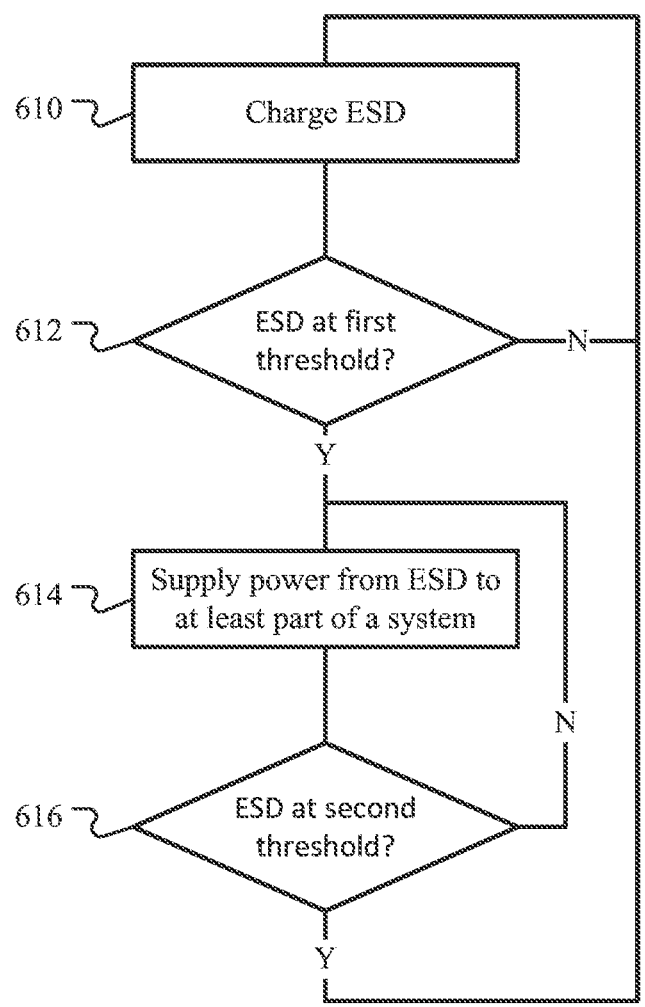
FIG. 6A is a flowchart illustrating power supply and storage using an energy harvest and storage system according to an embodiment.

FIG. 6 is a flowchart illustrating power supply and storage using an energy harvest and storage system according to an embodiment. In this embodiment, in 610, an energy storage device is charged from an energy harvesting device. If, in 612, a state of the energy storage device has not reached a first threshold, the energy storage device may continue to be charged in 610. If the state of the energy storage device has reached the first threshold, the power from the energy storage device may be supplied in 614. For example, as described above, at least part of the system 400 may be powered from the energy storage device after the state of the energy storage device reaches the first threshold. The supply of power from the energy storage device may continue until a state of the energy storage device reaches a second threshold in 616. For example, power of the at least part of the module from the energy storage device to may be switched to another power source after the state of the energy storage device reaches the second threshold.

In an embodiment, by cycling between charging in 610 and supplying power in 614 may reduce power consumption. However, in other embodiments, the energy storage device may be substantially continuously charged from an energy harvesting device.

In an embodiment, the state of the energy storage device used in 612 and 616 may, but need not be the same state. For example, in one embodiment, the state in both 612 and 616 may be a voltage of the energy storage device. Once the voltage reaches an upper threshold voltage, the energy storage device may have a sufficient amount of energy to power a desired system for a desired amount of time. At that time, in 614 the power may be supplied from the energy storage device. Once the voltage reaches a lower threshold, the energy storage device may be charged in 610. In another example, a charge current for the energy storage device may be used as the state in 612 and a voltage may be used as the state in 616. Other combinations are possible depending on the type of the energy storage device.

Figure 6B:
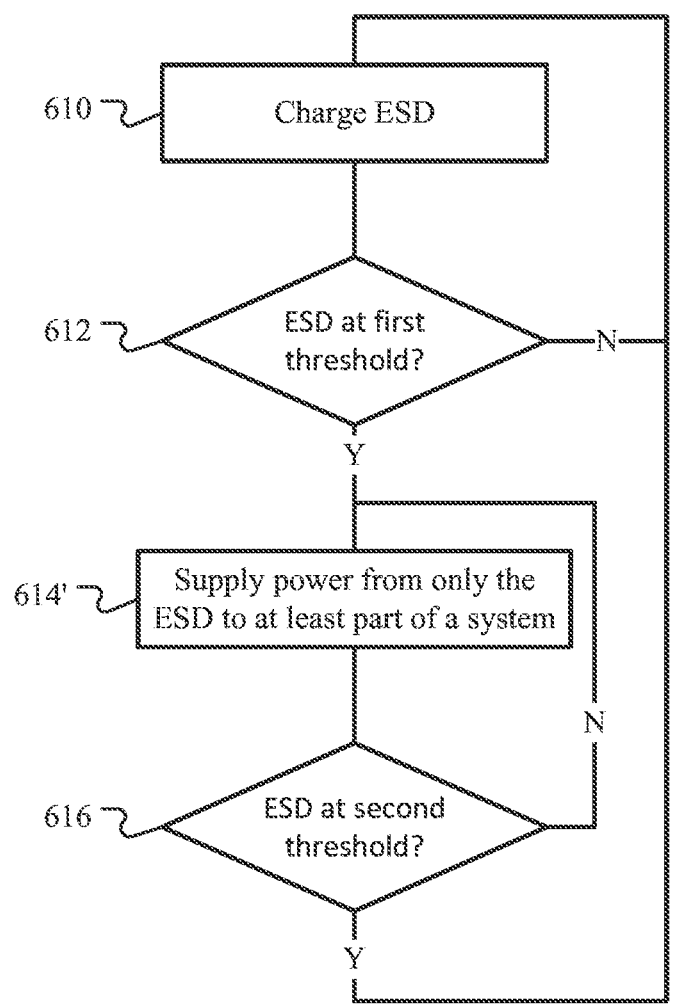
FIG. 6B is a flowchart illustrating power supply and storage using an energy harvest and storage system according to another embodiment.

FIG. 6B is a flowchart illustrating power supply and storage using an energy harvest and storage system according to another embodiment. This flowchart is similar to that of FIG. 6A; however, in 614', energy is supplied to at least part of the system from only the energy storage device.

Figure 7:
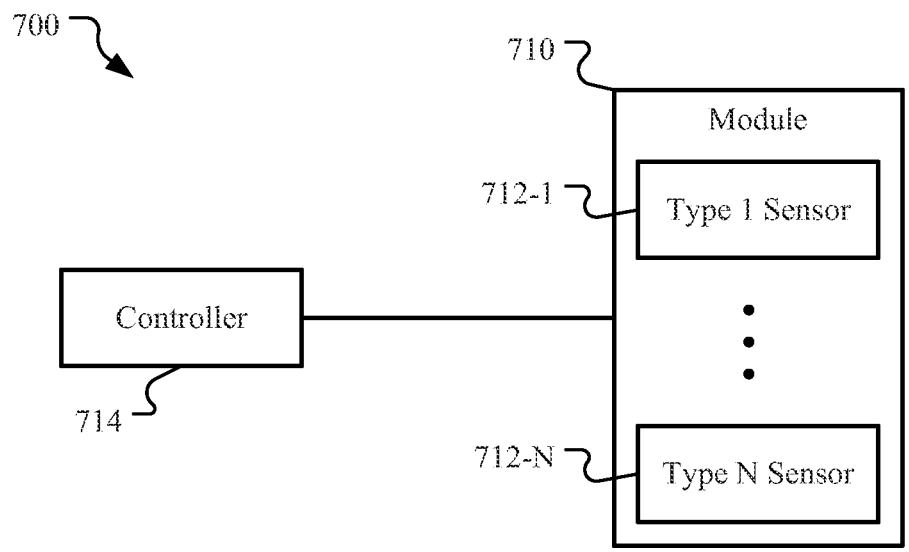
FIG. 7 is a block diagram of a system including a multi-sensor module according to an embodiment.

FIG. 7 is a block diagram of a system including a multi-sensor module according to an embodiment. In this embodiment, a system 700 includes a module 710. The module 710 may include a variety of semiconductor devices. For example, memory devices, processors, storage devices, or the like may be disposed on the module 710. However, such components are not illustrated for clarity.

Multiple sensors 712 may be disposed on the module 710. A type of at least one of the sensors 712 is different from a type of another sensor of the sensors 712. Here, sensor 712-1 is a sensor of a first type. Sensor 712-N is a sensor of an N-th type. The first type and the N-th type are different. N may be any integer greater than 1. Although a type of at least one sensor 712 is different from a type of another sensor, multiple sensors on the module 710 may have the same type. Sensors of the same type are not illustrated for clarity.

The types of the sensors may include any variety of types. For example, the types may include temperature sensors, humidity sensors, pressure sensors, acceleration sensors, or the like. In a particular embodiment, the module 710 may include a temperature sensor, a humidity sensor, and a pressure sensor as the sensors 712.

In an embodiment, the module 710 may be coupled to a controller 714. The controller 714 may be configured to receive information from the sensors 712 of the module 710. The controller 714 may also be configured to communicate with the module 710 in other ways.

Figure 8:
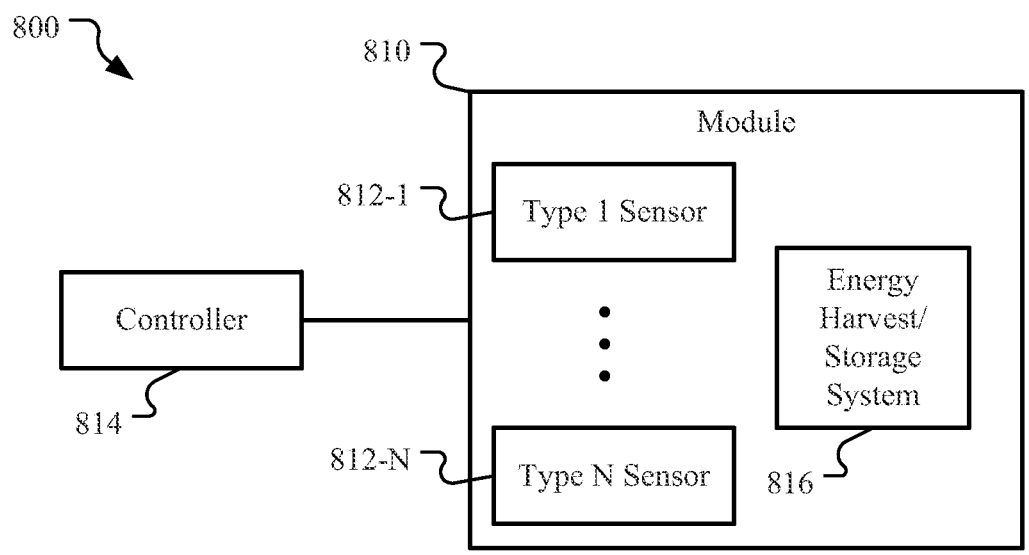
FIG. 8 is a block diagram of a system including a multi-sensor module according to another embodiment.

FIG. 8 is a block diagram of a system including a multi-sensor module according to another embodiment. In this embodiment, the system 800, module 810, sensors 812, and controller 814 are similar to the system 700, module 710, sensors 712, and controller 714. However, in this embodiment the module 810 also includes an energy harvest/storage system 816.

The energy harvest/storage system 816 may include an energy harvesting device, an energy storage device, and a power supply configured to supply power to at least part of the module 810 similar to those described above. For example, the energy harvest/storage system 816 may be configured to supply power to the sensors 812. In a particular example, the energy harvest/storage system 816 may be configured to supply power to the sensors only from the energy storage device. However, in other example, the power for the sensors 812 may be supplemented from the energy harvest/storage system 816.

Figure 9:
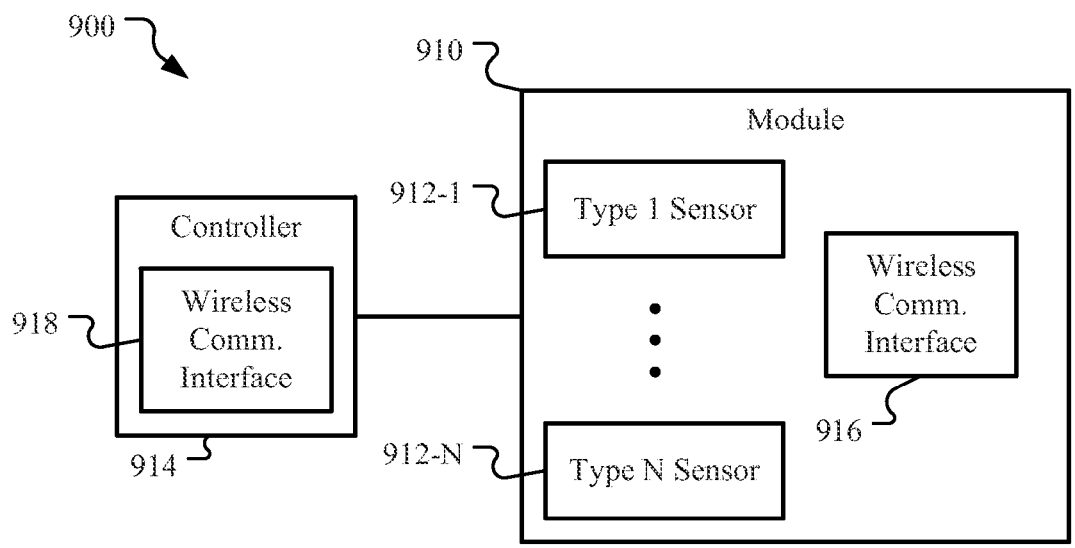
FIG. 9 is a block diagram of a system including a multi-sensor module according to another embodiment.

FIG. 9 is a block diagram of a system including a multi-sensor module according to another embodiment. In this embodiment, the system 900, module 910, sensors 912, and controller 914 are similar to the system 700, module 710, sensors 712, and controller 714. However, in this embodiment the module 910 includes a wireless communication interface 916 and the controller 914 includes a wireless communication interface 918.

In an embodiment, the wireless communication interface 916 may be a wireless transmitter configured to transmit information from the sensors 912. The wireless communication interface 918 may include a wireless receiver. The wireless communication interface 916 and the wireless communication interface 918 may be interfaces for a Bluetooth network, a Zigbee network, or other types of wireless networks. The wireless communication interface 916 and the wireless communication interface 918 may, but need not be full transceivers.

In an embodiment, similar to the module 810 of FIG. 8, the module 910 may also include an energy harvest/storage system. The energy harvest/storage system may be configured to supply power to the sensors 910 and the wireless communication interface 916. In a particular embodiment, the sensors 912 may include a temperature sensor. If the energy harvest/storage system operates on thermal energy, a sufficient amount of energy may not be generated to power the sensors 912, the wireless communication interface 916, or the like. However, in such a circumstance, the temperature of the module 910 may be low enough to not be a concern. Once the temperature rises sufficiently to become a concern, the energy harvest/storage system may be configured to supply a sufficient power at that threshold to power the sensors 912 and the wireless communication interface 916.

Although one wireless communication interface 916 has been illustrated for the module 910, in an embodiment, each sensor 912 may have a wireless communication interface 916. Moreover, as will be described in further detail below, multiple modules 910 may be present, each with one or more wireless communication interfaces 916. The wireless communication interfaces 916 of the modules 910 may be configured in a mesh network, a star network, a tree network or the like.

Although wireless communication has been described with respect to FIG. 9, in other embodiments, the communication between the sensors and the controller may be through wired interfaces, such as the System Management Bus (SMBus) or other communication interfaces. However, in an embodiment, such wired interfaces may be replaced by the wireless interfaces described above. Accordingly, space on the module 910, the controller 918, a circuit board on which the module 910 and the controller 918 are mounted, or the like may still communicate information from the sensors 912 while using less interconnections, traces, routes, or the like for wired connections. Accordingly, a cost of the system 900 may be reduced.

Although different components, such as the energy harvest/storage system 816 of FIG. 8 and the wireless communication interface 916 of FIG. 9 have been separately described above, a module may include various combinations of such components. For example, a module may include both the energy harvest/storage system 816 and the wireless communication interface 916. Moreover, although only one module is illustrated, any number of modules may be present. A single module was used for clarity.

Figure 10:
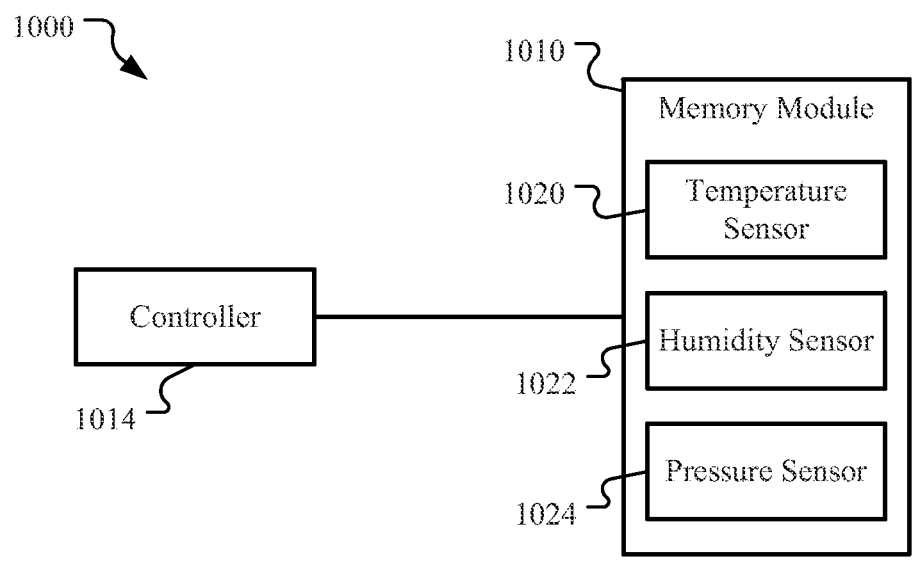
FIG. 10 is a block diagram of a system including a multi-sensor memory module according to another embodiment.

FIG. 10 is a block diagram of a system including a multi-sensor memory module according to another embodiment. In this embodiment, the system 1000 includes a memory module 1010. The memory module 1010 may include one or more semiconductor memory devices. For example, the memory module 1010 may be a DIMM.

The memory module 1010 includes sensors with at least three types. In particular, the sensors may be a temperature sensor 1020, a humidity sensor 1022, and a pressure sensor 1024. The combination of these sensors may allow for better control of cooling of the memory module 101. For example, at a given temperature, an amount of cooling provided by an air supply may vary based on humidity and pressure, in addition to the temperature. Because the humidity and pressure may be sensed, the amount of cooling may be more precisely controlled. As a result, the amount of cooling need not be set to a worst case scenario for a given temperature.

The memory module 1010 may be coupled to a controller 1014. For example, the memory module 1010 may be coupled to the controller through a wired interface, or a wireless interface as described above.

Moreover, the memory module 1010 may include an energy harvest/storage system as described above. Accordingly, in an embodiment, the temperature sensor 1020, humidity sensor 1022, and pressure sensor 1024 may be powered from the energy harvest/storage system. In particular, memory devices on the memory module 1010 may generate an amount of heat that is sufficient to power the sensors 1020, 1022, and 1024. As described above, if the amount of heat is not sufficient to power the sensors through the energy harvest/storage system, then the amount of heat may be substantially at or below an amount at which additional cooling is desired or needed.

In a particular embodiment, when using wireless communication and an energy harvest/storage system described above, the multiple sensors 1020, 1022, and 1024 may be added with a reduced impact. As described above, the wireless communication interface may reduce a need for additional wired connections to the controller 1014. Moreover, if the sensors 1020, 1022, and 1024 are powered from an energy harvest/storage system, the power consumption of the module 1010 without the additional sensors may stay substantially the same or be reduced.

Figure 11:
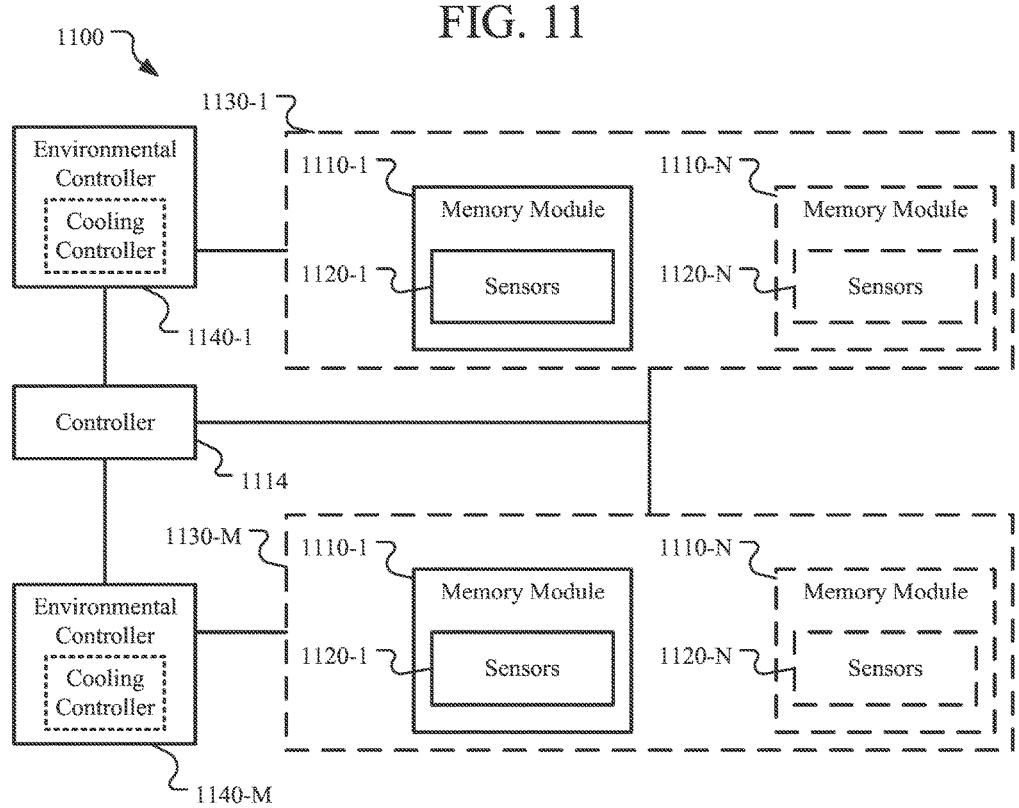
FIG. 11 is a block diagram of a system including a multi-sensor module according to another embodiment.

FIG. 11 is a block diagram of a system including a multi-sensor module according to another embodiment. In this embodiment the system 1100 includes zones 1130 of memory modules 1110. Here, the system 1100 includes one to M zones 1130. Each zone 1130 includes from one to N memory modules 1110. Each memory module 1110 includes sensors 1120. For example, the sensors 1120 may be the sensors described above with respect to FIG. 10.

Each zone is coupled to an environmental controller 1140. The environmental controller 1140 represents the controllable aspects of the environment with respect to the associated zone 1130. For example, the environmental controller 1140 may include a fan that directs air over the zone 1130. Each zone 1130 may have its own associated fan. However, in another embodiment, the environmental controllers 1140 may be part of a combined system where portions associated with each zone 1130 may be substantially individually controlled. For example, the environmental controllers 1140 may include a common fan for generating an airflow; however, each individual environmental controller 1140 may have associated ducting, valves, or the like for controlling the portion of the airflow from the common fan directed towards the associated zone.

The controller 1114 may be coupled to the memory modules 1110 of the zones 1130. The controller 1114 may be configured to receive information from the sensors 1120 of the memory modules 1110. Accordingly, the controller may be configured to adjust an amount of cooling provided to the memory modules 1110 and/or zones 1130 in response to the information from the sensors. In particular, the controller 1114 may be coupled to the environmental controllers 1140 and configured to actuate the environmental controllers 1140 in response to the information from the sensors.

In an embodiment, the controller 1114 may receive information from the sensors that identifies a location of the memory module 1110. For example, an identification may be encoded in the information received from the sensors 1120. The controller 1114 may be configured to correlate the identification with serial presence detect (SPD) information from the memory modules, channel/slot information of the memory modules 1120, or the like to determine a zone 1130 of the memory modules 1120. Accordingly, the controller 1114 may be configured to control the appropriate environmental controller 1140 in response to the sensor information from the associated sensors. Although using zones of multiple memory modules 1120 has been used as an example, the environment of the memory modules 1110 may be controlled at a memory module level granularity.

Figure 12:
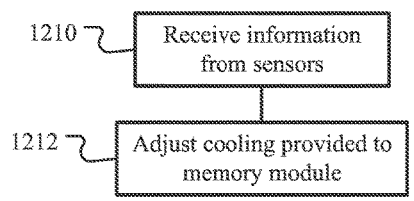
FIG. 12 is a flowchart illustrating operations of a controller according to some embodiments.

FIG. 12 is a flowchart illustrating operations of a controller according to some embodiments. In 1210, a controller receives information from sensors of a memory module. In 1212, the controller adjusts an amount of cooling provided to the memory modules.

Figure 13:
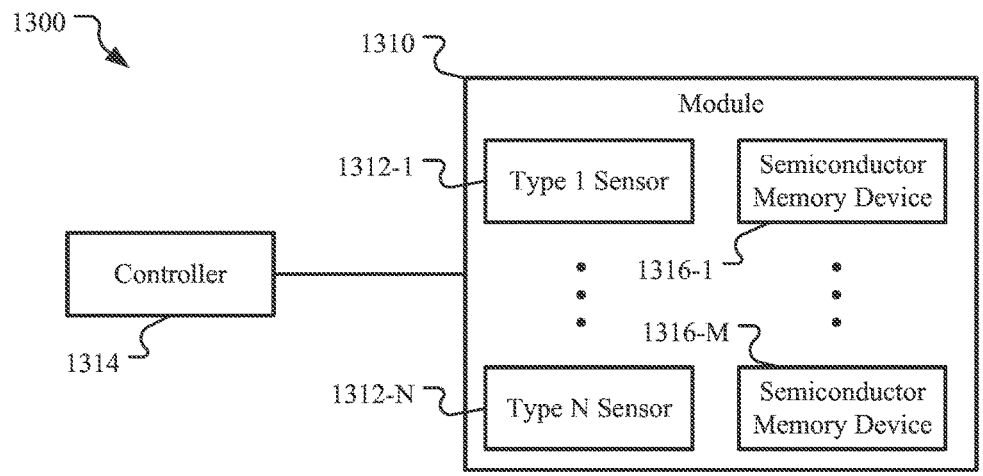
FIG. 13 is a block diagram of a system including a multi-sensor memory module according to an embodiment.

FIG. 13 is a block diagram of a system including a multi-sensor memory module according to an embodiment. In this embodiment, the system 1300 includes a memory module 1310, sensors 1312, and controller 1314 similar to the system 700 of FIG. 7, which includes a module 710, sensors 712, and controller 714. The memory module 1310 may include a variety of semiconductor devices. Here, the memory module 1310 includes semiconductor, memory devices 1316-1 to 1316-M disposed on the memory module 1310.

Multiple sensors 1312 may be disposed on the memory module 1310. A type of at least one of the sensors 1312 is different from a type of another sensor of the sensors 1312. Here, sensor 1312-1 is a sensor of a first type. Sensor 1312-N is a sensor of an N-th type. The first type and the N-th type are different. N may be any integer greater than 1. Although a type of at least one sensor 1312 is different from a type of another sensor, multiple sensors on the memory module 1310 may have the same type. Sensors of the same type are not illustrated for clarity.

The types of the sensors may include any variety of types. For example, the types may include temperature sensors, humidity sensors, pressure sensors, acceleration sensors, or the like. In a particular embodiment, the memory module 1310 may include a temperature sensor, a humidity sensor, and a pressure sensor as the sensors 1312.

In an embodiment, the memory module 1310 may be coupled to a controller 1314. The controller 1314 may be configured to receive information from the sensors 1312 of the memory module 1310. The controller 1314 may also be configured to communicate with the memory module 1310 in other ways.

Figure 14:
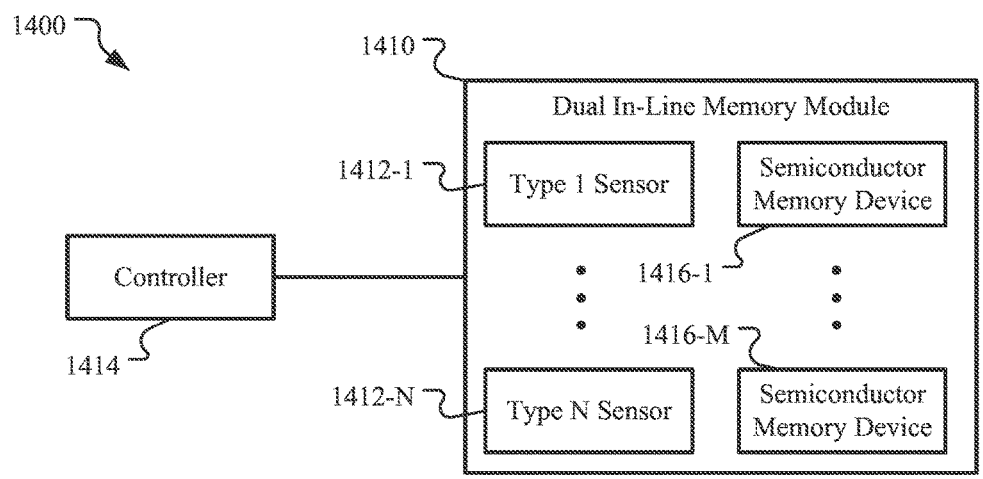
FIG. 14 is a block diagram of a system including a multi-sensor dual in-line memory module according to an embodiment.

FIG. 14 is a block diagram of a system including a multi-sensor dual in-line memory module according to an embodiment. In this embodiment, the system 1400 includes a dual in-line memory module (DIMM) 1410, sensors 1412, controller 1414, and semiconductor memory devices 1416 similar to the system 1300 of FIG. 13, which includes a memory module 1310, sensors 1312, controller 1314, and semiconductor memory devices 1316.

Although the structures, methods, and systems have been described in accordance with exemplary embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. A system, comprising:
a power source;
a circuit board;
a first integrated circuit disposed on the circuit board;
a second integrated circuit separate from the first integrated circuit and disposed on the circuit board;
an energy harvesting device configured to convert energy from the first integrated circuit to electrical energy;
an energy storage device configured to store the electrical energy; and
a power supply configured to, while supplying power to the first integrated circuit from the power source, switch between supplying power from the energy storage device to the second integrated circuit and supplying power from the power source to the second integrated circuit.

2. The system of claim 1, wherein the energy is thermal energy.

3. The system of claim 1, wherein the energy harvesting device comprises a thermoelectric material disposed on the first integrated circuit.

4. The system of claim 1, wherein the energy storage device comprises a capacitor configured to store the electrical energy.

5. The system of claim 1, wherein the second integrated circuit is a controller configured to manage an operation of the first integrated circuit.

6. The system of claim 5, wherein the controller is configured to cause the first integrated circuit to perform a shutdown function based on a loss of power from the power source.

7. A system, comprising:
a memory module including:
a circuit board;
a plurality of semiconductor memory devices disposed on the circuit board; and
a plurality of sensors disposed on the circuit board;
wherein a type of at least one of the sensors is different from a type of another sensor of the sensors; an energy harvesting device configured to convert energy from the semiconductor memory devices to electrical energy; an energy storage device configured to store the electrical energy; and a power supply configured to supply power to at least part of the memory module from the energy storage device; the power supply, while supplying power to the semiconductor memory devices from a power source, switch between supplying power from the energy storage device to the at least part of the memory module and supplying power from the power source to the at least part of the memory module.

8. The system of claim 7, wherein the sensors include a temperature sensor, a humidity sensor, and a pressure sensor.

9. The system of claim 7, wherein the memory module is a dual in-line memory module (DIMM).

10. The system of claim 7, wherein the at least part of the memory module includes the sensors.

11. The system of claim 10, wherein the power supply is configured to supply power to the sensors only from the energy storage device.

12. The system of claim 7, further comprising a controller separate from the memory module and configured to receive information from the sensors.

13. The system of claim 12, wherein:
the controller includes a wireless communication interface; and
the controller is configured to receive the information from the sensors through the wireless communication interface.

14. The system of claim 12, wherein the controller is configured to adjust an amount of cooling provided to the memory module in response to the information from the sensors.

15. A method, comprising:
harvesting energy from a semiconductor memory device on a circuit board of a memory module;
storing the harvested energy in an energy storage device on the circuit board of the memory module; and
powering at least part of the memory module from only the energy storage device;
wherein the at least part of the memory module includes a plurality of sensors on the circuit board of the memory module; while supplying power to the semiconductor memory devices from a power source, switch between supplying power from the energy storage device to the at least part of the memory module and supplying power from the power source to the at least part of the memory module.

16. The method of claim 15, further comprising:
storing the harvested energy in the energy storage device until a state of the energy storage device reaches a first threshold; and
powering the at least part of the memory module from the energy storage device after the state of the energy storage device reaches the first threshold.

* * * * *